(12) United States Patent
Park et al.

(10) Patent No.: US 11,217,317 B2
(45) Date of Patent: Jan. 4, 2022

(54) MEMORY DEVICE CAPABLE OF IMPROVING A THRESHOLD VOLTAGE DISTRIBUTION OF MEMORY CELLS AND METHOD OF OPERATING THE MEMORY DEVICE

(71) Applicant: SK hynix Inc., Icheon-si (KR)

(72) Inventors: Jong Kyung Park, Guri-si (KR); Ji Hyun Seo, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/784,160

(22) Filed: Feb. 6, 2020

(65) Prior Publication Data

US 2021/0027849 A1 Jan. 28, 2021

(30) Foreign Application Priority Data

Jul. 26, 2019 (KR) .......................... 10-2019-0091216

(51) Int. Cl.
  *G11C 16/34* (2006.01)
  *G11C 16/12* (2006.01)
  *G06F 12/0882* (2016.01)
  *G11C 16/24* (2006.01)
  *G06F 12/02* (2006.01)
  *G11C 16/08* (2006.01)

(52) U.S. Cl.
  CPC ...... *G11C 16/3436* (2013.01); *G06F 12/0246* (2013.01); *G06F 12/0882* (2013.01); *G11C 16/08* (2013.01); *G11C 16/12* (2013.01); *G11C 16/24* (2013.01)

(58) Field of Classification Search
  CPC ..... G11C 16/3436; G11C 16/08; G11C 16/12; G11C 16/24; G06F 12/0246; G06F 12/0882
  See application file for complete search history.

(56) References Cited

U.S. PATENT DOCUMENTS

| | | | | |
|---|---|---|---|---|
| 8,923,060 | B2* | 12/2014 | Shim | G11C 16/3459 365/185.18 |
| 9,728,262 | B2* | 8/2017 | Baran | G11C 16/3495 |
| 10,199,116 | B2* | 2/2019 | Shim | G11C 16/10 |
| 10,614,886 | B2* | 4/2020 | Joe | G11C 16/10 |

FOREIGN PATENT DOCUMENTS

| KR | 101635505 B1 | 7/2016 |
|---|---|---|
| KR | 1020180032427 A | 3/2018 |
| KR | 101915719 B1 | 1/2019 |

* cited by examiner

*Primary Examiner* — Vanthu T Nguyen
(74) *Attorney, Agent, or Firm* — William Park & Associates Ltd.

(57) ABSTRACT

A memory device according to an embodiment includes a memory cell block including a plurality of pages with each page corresponding to a word line of a plurality of word lines, a peripheral circuit configured to perform a program operation on the plurality of pages, and control logic configured to control the peripheral circuit to perform the program operation. The control logic changes and sets a bit line voltage applied to bit lines of the memory cell block during a program verify operation of the program operation according to a program order of each of the plurality of pages.

12 Claims, 11 Drawing Sheets

MEMORY DEVICE CAPABLE OF IMPROVING A THRESHOLD VOLTAGE DISTRIBUTION OF MEMORY CELLS AND METHOD OF OPERATING THE MEMORY DEVICE

CROSS-REFERENCE TO RELATED APPLICATION

The present application claims priority under 35 U.S.C. § 119(a) to Korean patent application number 10-2019-0091216 filed on Jul. 26, 2019, the entire disclosure of which is incorporated herein by reference.

BACKGROUND

1. Technical Field

Various embodiments generally relate to an electronic device, and more particularly, to a memory device and a method of operating the memory device.

2. Related Art

Semiconductor devices, in particular, memory devices, may be classified as volatile memory devices or nonvolatile memory devices.

A nonvolatile memory device may have comparatively low write and read speeds, but may retain stored data in the absence of supplied power. Therefore, the nonvolatile memory device may be used when there is the need for storing data which should be retained regardless of a supply of power. Examples of nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase change Random Access Memory (PRAM), Magnetic RAM (MRAM), Resistive RAM (RRAM), and Ferroelectric RAM (FRAM). Flash memory may be classified into NOR-type memory and NAND-type memory.

Among these nonvolatile memory devices, flash memory may have both advantages of RAM, in which data is freely programmable and erasable, and advantages of ROM, in which data stored therein can be retained even without power. Flash memory has been widely used as storage media for portable electronic devices such as digital cameras, personal digital assistants (PDAs), and MP3 players.

Flash memory devices may be classified as two-dimensional semiconductor devices, in which memory strings are horizontally formed on a semiconductor substrate, or three-dimensional semiconductor devices, in which memory strings are vertically formed on a semiconductor substrate.

Three-dimensional semiconductor devices are designed to overcome integration limits of two-dimensional semiconductor devices and include a plurality of memory strings vertically formed on a semiconductor substrate. Each of the memory strings may include a drain select transistor, memory cells, and a source select transistor coupled in series between a bit line and a source line.

SUMMARY

Various embodiments provide a memory device capable of improving a threshold voltage distribution of memory cells during a program operation, and a method of operating the memory device.

According to an embodiment, a memory device may include a memory cell block including a plurality of pages, wherein each of the plurality of pages corresponds to a word line of a plurality of word lines. The memory device may further include a peripheral circuit configured to perform a program operation on the plurality of pages and control logic configured to control the peripheral circuit to perform the program operation. The control logic may change and set a bit line voltage applied to bit lines of the memory cell block during a program verify operation of the program operation according to a program order of each of the plurality of pages.

According to an embodiment, a memory device may include a memory cell block including a plurality of pages, wherein each of the plurality of pages corresponds to a word line of a plurality of word lines sequentially disposed between a source line and bit lines. The memory device may also include a peripheral circuit configured to perform a program operation on the plurality of pages and control logic configured to control the peripheral circuit to perform the program operation. The control logic may gradually decrease and set a bit line voltage applied to the bit lines of the memory cell block during a program verify operation of the program operation according to a program order of each of the plurality of pages.

According to an embodiment, a method of operating a memory device may include providing a memory block including a plurality of pages, wherein each of the plurality of pages corresponds to a word line of a plurality of word lines. The method may further include setting a different bit line voltage for each of the plurality of pages according to a program order of each of the plurality of pages and performing a program operation by sequentially selecting the plurality of pages, wherein a set bit line voltage is applied to bit lines of the memory block during a program verify operation of the program operation.

DETAILED DESCRIPTION

Figure 1:
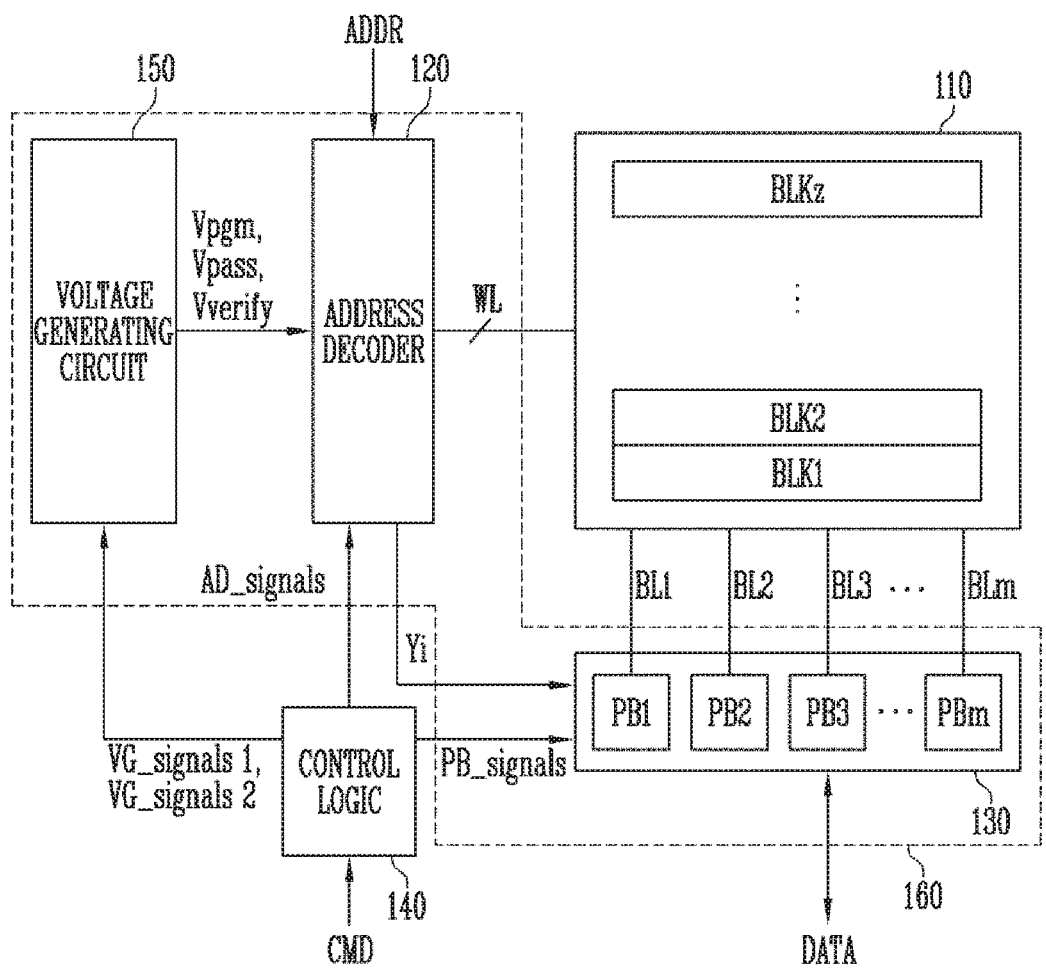
FIG. 1 is a block diagram illustrating a memory device according to an embodiment.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components should not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination of those described in the specification is present, but do not exclude a possibility of presence or addition of one or more other features, numbers, steps, operations, components, parts or combinations thereof, in advance.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies are not be described in detail to avoid ambiguousness of the present teachings. This intends to disclose the gist of the present disclosure more clearly by omitting unnecessary description.

Hereinafter, embodiments of the present disclosure are described in detail with reference to the accompanying drawings in order for those skilled in the art to be able to readily implement the technical spirit of the present disclosure.

FIG. 1 is a block diagram illustrating a memory device 100 according to an embodiment.

Referring to FIG. 1, the memory device 100 may include a memory cell array 110, an address decoder 120, a read and write circuit 130, control logic 140, and a voltage generating circuit 150. The address decoder 120, the read and write circuit 130, and the voltage generating circuit 150 may be defined as a peripheral circuit 160 configured to perform a read operation on the memory cell array 110.

The memory cell array 110 may include a plurality of memory blocks BLK1 to BLKz, also referred to as memory cell blocks. The plurality of memory blocks BLK1 to BLKz may be coupled to the address decoder 120 through word lines WLs. The memory blocks BLK1 to BLKz may be coupled to the read and write circuit 130 through bit lines BL1 to BLm. Each of the plurality of memory blocks BLK1 to BLKz may include a plurality of memory cells. In an embodiment, the plurality of memory cells may be nonvolatile memory cells. Memory cells coupled to a single word line among the plurality of memory cells may be defined as a single page. Thus, the memory cell array 110 may include a plurality of pages.

Each of the memory blocks BLK1 to BLKz of the memory cell array 110 may include a plurality of memory strings. Each of the plurality of memory strings may include a drain select transistor, a plurality of memory cells, and a source select transistor coupled in series between a bit line and a source line. The memory cell array 110 is described in detail below.

The address decoder 120 may be coupled to the memory cell array 110 through the word lines WLs. The address decoder 120 may be configured to operate in response to address decoder control signals AD_signals generated in the control logic 140. The address decoder 120 may receive an address ADDR through an input/output buffer (not illustrated) in the memory device 100.

The address decoder 120 may decode a row address among the received address ADDR and apply a plurality of operating voltages including a program voltage Vpgm, a pass voltage Vpass, and a program verify voltage Vverify generated in the voltage generating circuit 150 to the plurality of memory cells of the memory cell array 110 according to the decoded row address during the program operation.

The address decoder 120 may be configured to decode a column address among the address ADDR received during the program operation. The address decoder 120 may transfer the decoded column address Yi to the read and write circuit 130.

The address ADDR received during the program operation may include a block address, a row address, and a column address. The address decoder 120 may select one memory block and one word line according to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may select and apply a program inhibition voltage or one of program permission voltages to the bit lines BL1 to BLm according to data to be programmed during a program voltage applying operation of a program operation. In addition, each of the plurality of page buffers PB1 to PBm may apply a set bit line voltage to the bit lines BL1 to BLm during a program verify operation performed after the program voltage applying operation, and may then sense a potential level or an amount of current of the bit lines BL1 to BLm to perform a program verify operation. A bit line voltage may vary according to a program order of a plurality of pages included in a selected memory block. For example, a bit line voltage corresponding to a page which is programmed early among a plurality of pages may be set to have a higher level than a bit line voltage corresponding to a page which is programmed later among the plurality of pages. For example, when a plurality of pages are sequentially programmed, bit line voltages may be set to be gradually decreased.

The read and write circuit 130 may operate in response to page buffer control signals PB_signals output from the control logic 140.

According to some embodiments, the read and write circuit 130 may include page buffers (or page registers) and a column select circuit.

The control logic 140 may be coupled to the address decoder 120, the read and write circuit 130, and the voltage generating circuit 150. The control logic 140 may receive a command CMD through the input/output buffer (not illustrated) of the memory device 100. The control logic 140 may be configured to control the general operations of the memory device 100 in response to the command CMD. For example, the control logic 140 may receive the command CMD corresponding to the program operation and generate and output the address decoder control signals AD_signals to control the address decoder 120, the page buffer control signals PB_signals to control the read and write circuit 130, and voltage generating circuit control signals VG_signals 1 and VG_signals 2 to control the voltage generating circuit 150 in response to the received command CMD. For different embodiments, the control logic 140 may be implemented as hardware, software, or a combination of hardware and software. For example, the control logic 140 may be a control logic circuit operating in accordance with an algorithm and/or a processor executing control logic code.

The voltage generating circuit 150 may generate the plurality of operating voltages including the program voltage Vpgm, the pass voltage Vpass, and the program verify voltage Vverify in response to control of the voltage generating circuit control signals VG_signals 1 and VG_signals 2 output from the control logic 140 and may output the generated operating voltages to the address decoder 120 during the program operation.

The control logic 140 according to an embodiment may control the peripheral circuit 160 to sequentially program a plurality of pages included in a selected memory block during a program operation including a program voltage applying operation and a program verify operation. In addition, the control logic 140 may control the read and write circuit 130 to change and set a bit line voltage applied to a bit line selected according to a program order of selected pages during a program verify operation of a program operation, and to apply the set bit line voltage to bit lines during a program verify operation of the selected page. The bit line voltages may be set to be gradually decreased according to a program order. In other words, when a corresponding page is programmed early, a bit line voltage may be set to be relatively high and when a corresponding page is programmed later, a bit line voltage may be set to be relatively low.

For example, the control logic 140 may control the read and write circuit 130 to apply a first bit line voltage to the bit lines BL1 to BLm during a program verify operation of a program operation of a first page among a plurality of pages included in a selected memory block, and to apply a second bit line voltage having a lower potential level than the first bit line voltage to the bit lines BL1 to BLm during a program verify operation of a program operation of a second page among the plurality of pages included in the selected memory block. In addition, the control logic 140 may control the read and write circuit 130 to apply a third bit line voltage having a lower potential level than the second bit line voltage to the bit lines BL1 to BLm during a program verify operation of a program operation of a third page among the plurality of pages included in the selected memory block. In other words, the control logic 140 may control the peripheral circuit 160 to perform program operations by sequentially selecting a plurality of pages included in a selected memory block, and to perform the program operations by applying bit line voltages, which are gradually decreased according to a program order of the plurality of pages, to bit lines during a program verify operation.

Figure 2:
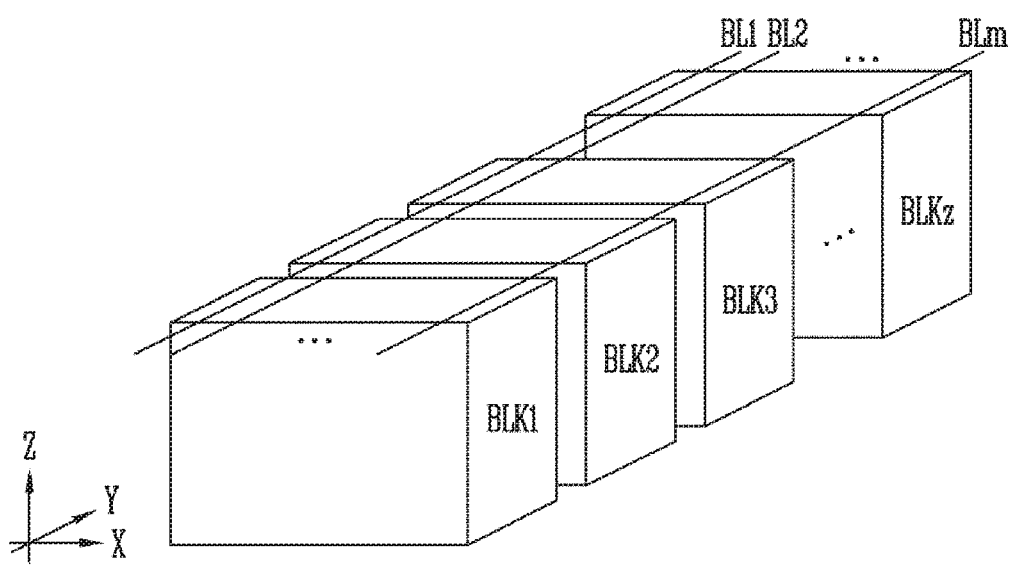
FIG. 2 is a diagram illustrating three-dimensionally structured memory blocks.

FIG. 2 is a diagram illustrating three-dimensionally structured memory blocks.

Referring to FIG. 2, the three-dimensionally structured memory blocks BLK1 to BLKz may be arranged to be spaced apart from each other in a second direction Y in which the bit lines BL1 to BLm extend. For example, the first to z memory blocks BLK1 to BLKz may be arranged to be spaced apart from each other in the second direction Y and may include a plurality of memory cells stacked in a third direction Z. The configuration of one of the first to z memory blocks BLK1 to BLKz is described in detail with reference to FIGS. 3, 4, and 5.

Figure 3:
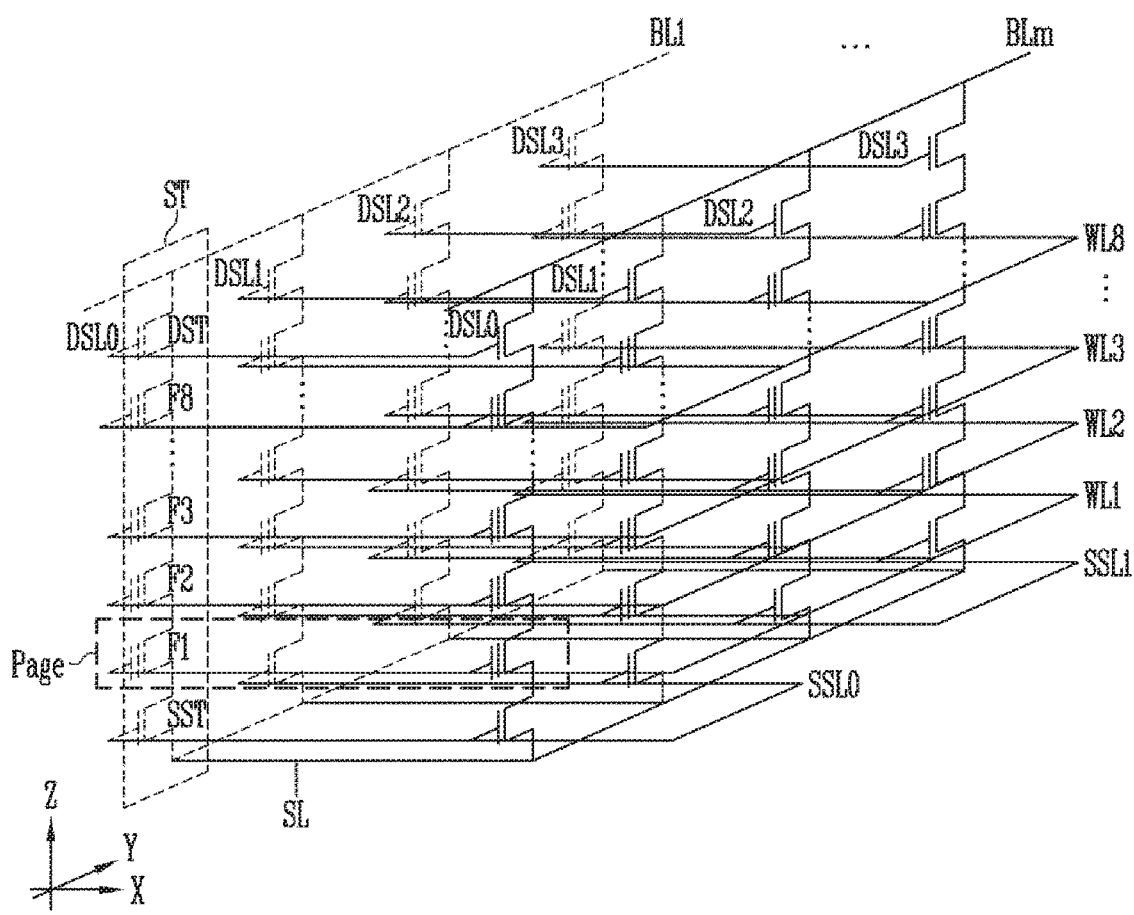
FIG. 3 is a detailed circuit diagram illustrating one of the memory blocks shown in FIG. 2.

FIG. 3 is a detailed circuit diagram illustrating one of the memory blocks shown in FIG. 2.

Figure 4:
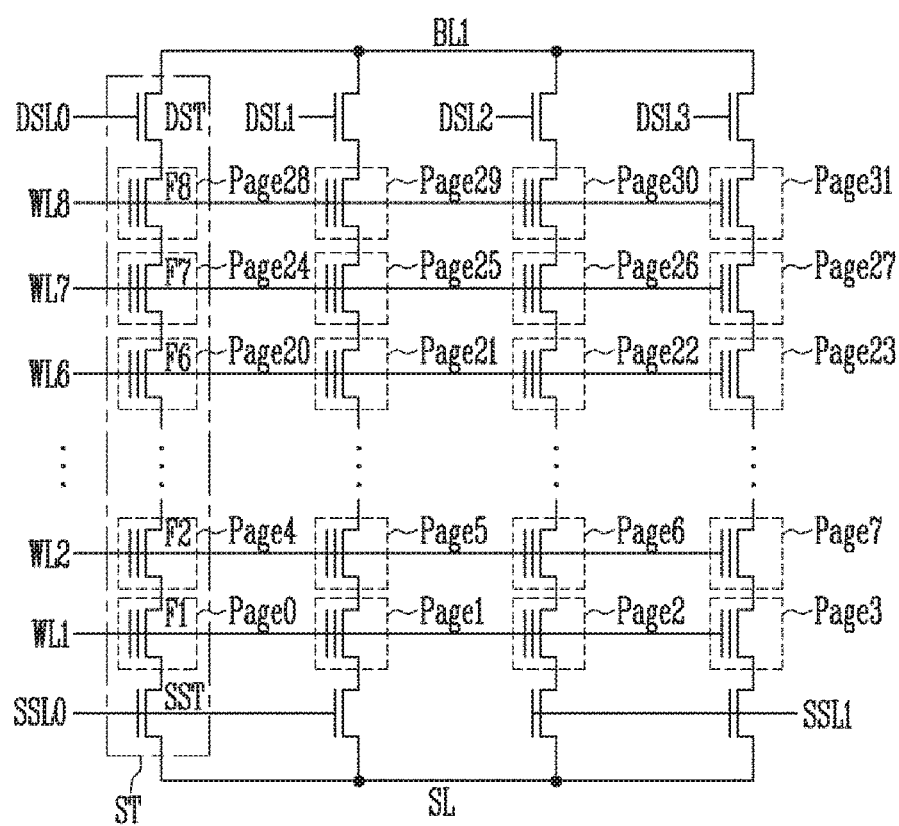
FIG. 4 is a circuit diagram illustrating memory strings shown in FIG. 3.

FIG. 4 is a circuit diagram illustrating memory strings shown in FIG. 3.

Figure 5:
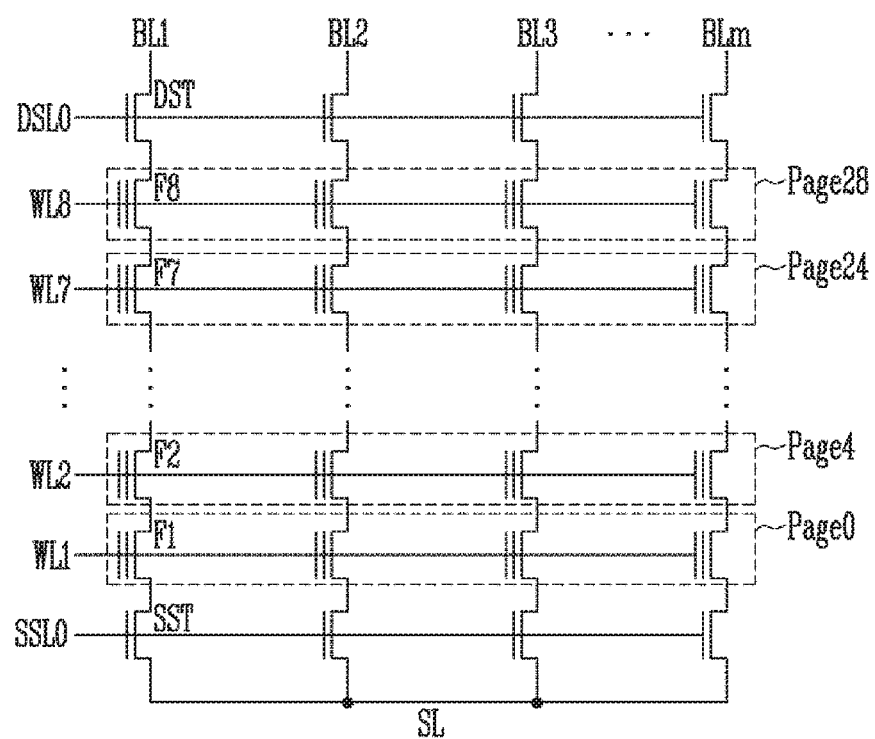
FIG. 5 is a circuit diagram illustrating pages shown in FIG. 3.

FIG. 5 is a circuit diagram illustrating pages shown in FIG. 3.

Referring to FIGS. 3, 4 and 5, each of memory strings ST may be coupled between the bit lines BL1 to BLm and a source line SL. The memory string ST coupled between the first bit line BL1 and the source line SL is described below as an example.

The memory string ST may include a source select transistor SST, memory cells F1 to F8, and a drain select transistor DST coupled in series between the source line SL and the first bit line BL1. Only eight (8) memory cells F1 to F8 are illustrated in the embodiment for convenience of explanation. However, the number of memory cells are not limited thereto, and the memory string ST may be configured to include more than eight memory cells.

Gates of the source select transistors SST included in different memory strings ST which are coupled to different bit lines BL1 to BLm may be coupled to a first source select line SSL0 and a second source select line SSL1. For example, source select transistors adjacent to each other in the second direction Y among the source select transistors SST may be coupled to the same source select line. For example, on the assumption that the source select transistors SST are sequentially arranged in the second direction Y, gates of the source select transistors SST arranged in a first direction X from the first source select transistor SST and included in different memory strings ST and gates of the source select transistors SST arranged in the first direction X from the second source select transistor SST and included in different memory strings ST may be coupled to the first source select line SSL0. In addition, gates of the source select transistors SST arranged in the first direction X from the third source select transistor SST and included in different memory strings ST and gates of the source select transistors SST arranged in the first direction X from the fourth source select transistor SST and included in different memory strings ST may be coupled to the second source select line SSL1.

Gates of the memory cells F1 to F8 may be coupled to word lines WL1 to WL8 and gates of the drain select transistors DST may be coupled to one of first, second, third, and fourth drain select lines DSL0, DSL1, DSL2, and DSL3.

Gates of transistors arranged in the first direction X among the drain select transistors DST may be coupled to the same drain select line (for example, DSL0) in common, but gates of transistors arranged in the second direction Y among the drain select transistors DST may be coupled to different drain select lines DSL1, DSL2, and DSL3. For example, on the assumption that the drain select transistors DST are sequentially arranged in the second direction Y, gates of the drain select transistors DST arranged in the first direction X from the first drain select transistor DST and included in different memory strings ST may be coupled to the first drain select line DSL0. The drain select transistors DST arranged in the second direction Y from the drain select transistors DST coupled to the first drain select line DSL0 may be sequentially coupled to the second, third, and fourth drain select lines DSL1, DSL2, and DSL3. Accordingly, the memory strings ST coupled to a selected drain select line may be selected and the memory strings ST coupled to remaining unselected drain select lines might not be selected in the selected memory block.

Memory cells coupled to a single word line among the memory cells included in the plurality of memory strings ST corresponding to a single drain select line (for example, DSL0) may form a single page Page. The page may refer to a physical page. For example, a group of memory cells coupled to the same word line in the first direction X among the memory strings ST coupled to the first bit line BL1 to the mth bit line BLm may refer to the page Page. For example, memory cells arranged in the first direction X among the first memory cells F1 coupled to the first word line WL1 may form a single page Page. Memory cells arranged in the second direction Y among the first memory cells F1 coupled to the first word line WL1 in common may define different pages.

For example, according to an embodiment, among the first memory cells F1 coupled to the first word line WL1, memory cells included in a memory string corresponding to the drain select line DSL0 may be defined as a first page Page0, memory cells included in a memory string corresponding to the drain select line DSL1 may be defined as a second page Page1, memory cells included in a memory string corresponding to the drain select line DSL2 may be defined as a third page Page2, and memory cells included in a memory string corresponding to the drain select line DSL3 may be defined as a fourth page Page3. In addition, among the second memory cells F2 coupled to the second word line WL2, memory cells included in a memory string corresponding to the drain select line DSL0 may be defined as a fifth page Page4, memory cells included in a memory string corresponding to the drain select line DSL1 may be defined as a sixth page Page5, memory cells included in a memory string corresponding to the drain select line DSL2 may be defined as a seventh page Page6, and memory cells included in a memory string corresponding to the drain select line DSL3 may be defined as an eighth page Page7.

When the drain select line DSL0 is a selected drain select line and the first word line WL1 is a selected word line, the first page Page0 coupled to the first drain select line DSL0, among the plurality of pages Page0, Page1, Page2, and Page3 coupled to the first word line WL1, may be a selected page. The pages Page1, Page2, and Page3 which are coupled to the first word line WL1 in common with the first page Page0 but are coupled to the unselected drain select lines DSL1, DSL2, and DSL3 may be unselected pages.

According to an embodiment, program operations may be performed by sequentially selecting a plurality of pages included in a selected memory block. For example, after a program operation of the first, second, third, and fourth pages Page0, Page1, Page2, and Page3 corresponding to the first word line WL1 is performed, a program operation of the fifth, sixth, seventh, and eighth pages Page4, Page5, Page6 and Page7 corresponding to the second word line WL2 may be performed. Subsequently, a program operation of pages corresponding to a next word line (for example, WL3) may be performed. In other words, program operations may be performed on pages by sequentially selecting pages from pages adjacent to the source line SL to pages adjacent to a bit line (for example, BL1). The order in which the program operations are performed as stated above may be defined as a normal program order. In other words, according to the normal program order, after a program operation on the plurality of pages Page0, Page1, Page2, and Page3 corresponding to the first word line WL1 adjacent to the source line SL, a program operation on the plurality of pages Page4, Page5, Page6, and Page7 corresponding to the next word line, that is, the second word line WL2, may be performed. Similarly, a plurality of pages corresponding to each of the rest of the word lines WL3 to WL8 may be sequentially programmed in a word line order. In other words, program operations of pages corresponding to each of word lines may be sequentially performed in a word line order from the first word line WL1 to the last word line WL8 disposed between the source line and the bit lines.

Alternatively, program operations may be performed by sequentially selecting the pages from the pages adjacent to the bit line (for example, BL1) to the pages adjacent to the source line SL in reverse order of the normal program order. The order in which the program operations are performed as stated above may be defined as a reverse program order. For example, after a program operation of the twenty-ninth, thirtieth, thirty-first, and thirty-second pages Page28, Page29, Page30, and Page31 corresponding to the eighth word line WL8 is performed, a program operation of the twenty-fifth, twenty-sixth, twenty-seventh, and twenty-eighth pages Page24, Page25, Page26, and Page27 corresponding to the seventh word line WL7 may be performed. Subsequently, a program operation of pages corresponding to the next word line (for example, WL6) may be performed. In other words, according to the reverse program order, program operations of pages corresponding to each of word lines may be sequentially performed in a word line order, from the word line WL8 which is the closest to the bit line to the word line WL1 which is the farthest from the bit line, among the plurality of word lines WL1 to WL8 disposed between the source line and the bit lines.

Program operations on a plurality of pages corresponding to the same word line may be performed by sequentially selecting the plurality of pages. For example, the plurality of pages Page0, Page1, Page2, and Page3 coupled to the first word line WL1 may be performed such that a program operation of the first page Page0, a program operation of the second page Page1, a program operation of the third page Page2, and a program operation of the fourth page Page3 may be sequentially performed. Bit line voltages applied to bit lines during respective program verify operations of a plurality of pages corresponding to the same word line may have the same potential level.

In FIGS. 3, 4, and 5, it is illustrated that one source select transistor SST and one drain select transistor DST are included in one memory string ST. However, a plurality of source select transistors SST and a plurality of drain select transistors DST may be included in one memory string ST depending on a memory device. In addition, dummy cells may be further included between the source select transistor SST and the memory cells F1 to F8, and/or between the memory cells F1 to F8 and the drain select transistor DST depending on a memory device. Dummy cells might not store user data unlike general memory cells F1 to F8 but may be used to improve electrical characteristics of each memory string ST. However, dummy cells are not an important configuration in this embodiment, therefore detailed description thereof is omitted.

Figure 6:
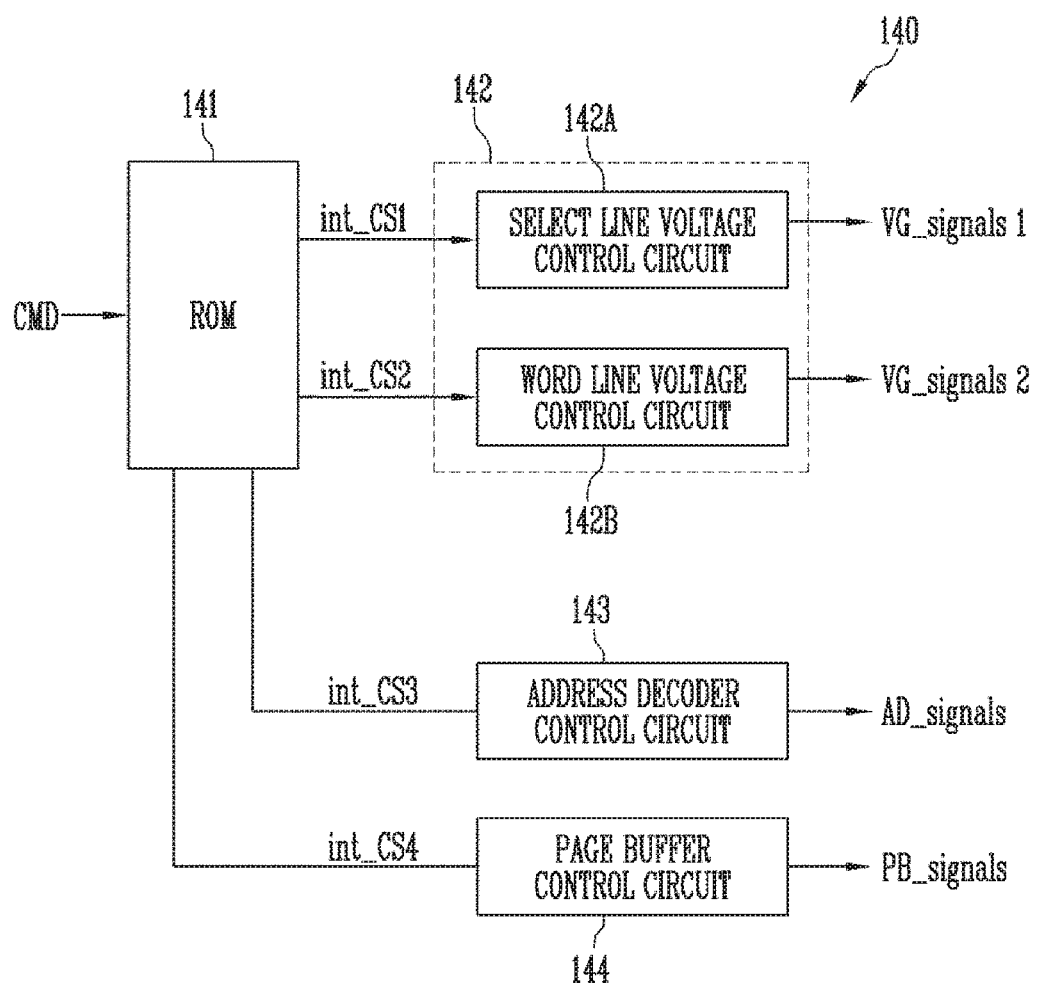
FIG. 6 is a diagram illustrating control logic shown in FIG. 1.

FIG. 6 is a diagram illustrating the control logic 140 shown in FIG. 1.

Referring to FIG. 6, the control logic 140 may include Read Only Memory (ROM) 141, a voltage generation control circuit 142, an address decoder control circuit 143, and a page buffer control circuit 144.

The ROM 141 may store an algorithm to perform general operations of the memory device 100 and generate a plurality of internal control signals int_CS1, int_CS2, int_CS3, and int_CS4 in response to the command CMD input from an external device, for example, a host coupled to the memory device 100.

The voltage generation control circuit 142 may include a select line voltage control circuit 142A and a word line voltage control circuit 142B. The select line voltage control circuit 142A may generate, in response to the internal control signal int_CS1, the first voltage generating circuit control signals VG_signals 1 to control the voltage generating circuit 150 shown in FIG. 1 to generate select line voltages applied to a selected memory block during a program operation of the memory device 100. The word line voltage control circuit 142B may generate, in response to the internal control signal int_CS2, the second voltage generating circuit control signals VG_signals 2 to control the voltage generating circuit 150 shown in FIG. 1 to generate the program voltage Vpgm, the pass voltage Vpass, and the program verify voltage Vverify applied to a selected memory block during a program operation of the memory device 100.

The address decoder control circuit 143 may output, in response to the internal control signal int_CS3, the address decoder control signals AD_signals to control the address decoder 120 shown in FIG. 1 during the general operations of the memory device 100.

The page buffer control circuit 144 may output, in response to the internal control signal int_CS4, the page buffer control signals PB_signals to control the read and write circuit 130 shown in FIG. 1 during the general operations of the memory device 100. The read and write circuit 130 may adjust a potential level of a bit line voltage applied to bit lines and apply the adjusted bit line voltage to the bit lines in response to the page buffer control signals PB_signals.

The control logic 140 according to an embodiment may generate and output the address decoder control signals AD_signals, the page buffer control signals PB_signals, and the voltage generating circuit control signals VG_signals 1 and VG_signals 2 to control the peripheral circuit 160 shown in FIG. 1 to perform program operations by sequentially selecting a plurality of pages included in a selected memory block according to a program order. The program order may be a normal program order, in which pages are sequentially selected from pages adjacent to a source line to pages adjacent to a bit line or a reverse program order, in which pages are sequentially selected from pages adjacent to a bit line to pages adjacent to a source line.

In addition, the control logic 140 may control the read and write circuit 130 to change bit line voltages applied to bit lines according to a program order during a program verify operation. For example, the read and write circuit 130 may be controlled such that bit line voltages applied to bit lines during a program verify operation are gradually decreased when program operations proceed along a program order.

Figure 7:
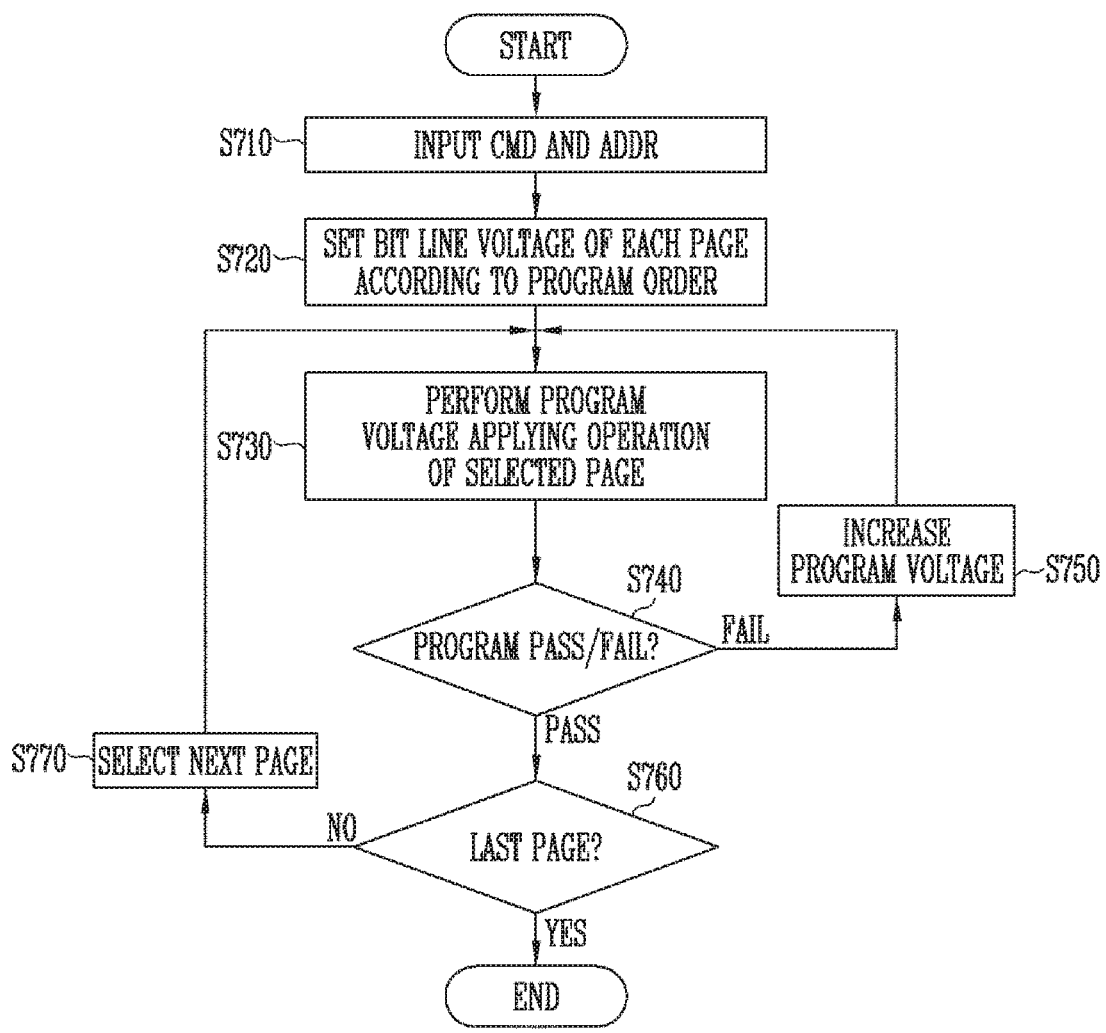
FIG. 7 is a flowchart illustrating a program operation of a memory device according to an embodiment.

FIG. 7 is a flowchart illustrating a program operation of a memory device according to an embodiment.

Figure 8:
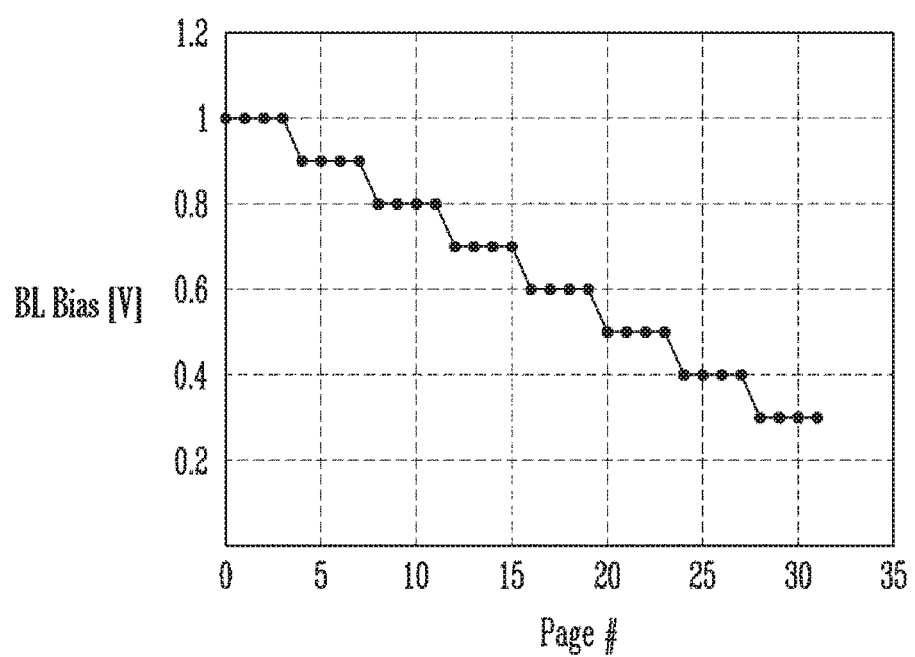
FIG. 8 is a voltage graph illustrating a bit line voltage applied to a bit line during a program verify operation of a program operation of a memory device according to an embodiment.

FIG. 8 is a voltage graph illustrating a bit line voltage applied to a bit line during a program verify operation of a program operation of a memory device according to an embodiment.

A program operation of a memory device according to an embodiment is described below with reference to FIGS. 1 to 8.

The memory device 100 may receive (S710), from an external device, the command CMD corresponding to a program operation and the address ADDR corresponding to memory cells on which the program operation is performed. In addition, the memory device 100 may receive data DATA to be programmed from the external device.

The memory device 100 may select one of the plurality of memory blocks, e.g., BLK1 to BLKz, included in the memory cell array 110 in response to the received command CMD and address ADDR, and may set a program order of a selected memory block (for example, BLK1) as a normal program order or a reverse program order. According to an embodiment, a program operation which is performed in a normal program order is described.

The control logic 140 of the memory device 100 may set (S720) a bit line voltage of each of the plurality of pages Page0 to Page31 included in the selected memory block BLK1 based on the set normal program order. A bit line voltage may be a voltage applied to the bit lines BL1 to BLm of the selected memory block BLK1 during a program verify operation. For example, the control logic 140 may set bit line voltages based on a normal program order such that when a selected page is programmed early, a bit line voltage corresponding to the selected page may be set to be high and when a selected page is programmed late, a bit line voltage corresponding to the selected page may be set to be low. Pages coupled to the same word line may be set to have the same bit line voltage.

Referring to FIG. 8, the pages Page0, Page1, Page2, and Page3 coupled to the first word line WL1 which are programmed first according to a normal program order may be set to have a bit line voltage BL Bias of 1V. The pages Page4, Page5, Page6, and Page7 coupled to the second word line WL2 which are programmed second according to the normal program order may be set to have a bit line voltage BL Bias of 0.9V. As set forth above, each of word lines may be set to have a bit line voltage BL Bias lower than a bit line voltage BL Bias of a previously programmed word line by 0.1V according to a program order. In different embodiments, the step voltage may be greater or less than 0.1V. For some embodiments, the step voltage may be constant, while for other embodiments, the step voltage may vary. Further, for additional embodiments, the bit line voltage BL Bias of the first programmed word line may begin at a voltage greater or less than 1.0V.

The control logic 140 may perform (S730) a program voltage applying operation of a selected page of the selected memory block BLK1 by controlling the peripheral circuit 160.

The plurality of page buffers PB1 to PBm of the read and write circuit 130 may temporarily store the received data DATA in response to the page buffer control signals PB_signals and apply a program inhibition voltage Vcc or a program permission voltage to corresponding bit lines BL1 to BLm in response to the received data DATA.

The voltage generating circuit 150 may generate and output the program voltage Vpgm and the pass voltage Vpass in response to the voltage generating circuit control signals VG_signals 1 and VG_signals 2. The address decoder 120 may decode a row address among the received address ADDR and apply the program voltage Vpgm and the pass voltage Vpass generated in the voltage generating circuit 150 to a plurality of memory cells of the memory cell array 110 according to the decoded row address. In other words, the program voltage Vpgm may be applied to a word line (for example, WL1) coupled to the selected page Page and the pass voltage Vpass may be applied to the remaining word lines WL2 to WL8.

Subsequently, program pass/fail may be determined (S740) with respect to a program operation of a selected page by performing a program verify operation.

The plurality of page buffers PB1 to PBm of the read and write circuit 130 may apply a set bit line voltage corresponding to a selected page to the bit lines BL1 to BLm in response to the page buffer control signals PB_signals during a program verify operation. For example, when a selected page is one of the plurality of pages Page0, Page1, Page2, and Page3 coupled to the first word line WL1, a bit line voltage may be set to 1V as shown in FIG. 8 and a bit line voltage of 1V may be applied to the bit lines BL1 to BLm during a program verify operation. Subsequently, the voltage generating circuit 150 may generate and output the program verify voltage Vverify and the pass voltage Vpass in response to the voltage generating circuit control signals VG_signals 1 and VG_signals 2. The address decoder 120 may apply the program verify voltage Vverify generated in the voltage generating circuit 150 to a word line (for example, WL1) coupled to the selected page Page and apply the pass voltage Vpass to the remaining word lines WL2 to WL8. The read and write circuit 130 may sense a potential level or an amount of current of the bit lines BL1 to BLm in response to the page buffer control signals PB_signals and determine program pass or program fail according to the sensing result.

When it is determined that a program operation of a selected page fails (Fail) as a result of the program verification operation (S740), the control logic 140 may set (S750) the program voltage Vpgm having a level increased from a program voltage used during the previously performed program operation by a step voltage and may control the peripheral circuit 160 to perform the operation again from the above-stated step S730.

When it is determined that a program operation of a selected page passes (Pass) as a result of the program verification operation (S740), the control logic 140 may check (S760) whether a currently selected page is the last page on which a program operation is to be performed.

When it is determined that the currently selected page is the last page (Yes), the program operation is finished. When it is determined that the currently selected page is not the last page (No), a next page may be selected (S770).

When the next page is selected in the previous step, the control logic 140 may control the peripheral circuit 160 to perform the program operation again from the above-stated step S730 and to use a bit line voltage corresponding to a next page of the selected page during the program verify operation.

A value of drain resistance and a value of source resistance of memory cells included in the selected page may be different from each other during a program operation of a memory device according to a program order. For example, because memory cells disposed between a memory cell included in a page selected during a program operation and the source line SL are memory cells on which program operations have been performed, and memory cells disposed between the selected memory cell and the bit lines BL1 to BLm are memory cells on which program operations have not been performed, that is, memory cells having an erase state, a value of drain resistance and a value of source resistance of memory cells included in the selected page may be different from each other. In addition, a value of drain resistance and a value of source resistance of a selected page may vary according to a program order. In other words, when a program operation on a selected memory cell is performed early (forepart) according to a program order, the number of programmed memory cells between the selected memory cell and the source line SL may be small and when a program operation on a selected memory cell is performed late (rear), the number of programmed memory cells between the selected memory cell and the source line SL may be greater. Accordingly, a value of source resistance and a value of drain resistance of selected memory cells may be changed during a program operation according to a program order of each of pages and a threshold voltage distribution of each of the pages may be inhomogeneous.

According to an embodiment, a bit line voltage applied to bit lines may be changed and applied according to a program order of a selected page during a program verify operation of a program operation. Accordingly, a change in channel current during the program verify operation, which is caused by change in values of drain resistance and source resistance of memory cells included in the selected page according to the program order, may be compensated. Accordingly, a threshold voltage distribution of memory cells may be uniform during the program operation, and thus the reliability of the program operation may be improved.

The embodiment in which program operations are performed in a normal program order is stated above. However, program operations may be performed in a reverse program order in which pages are sequentially selected from pages adjacent to a bit line to pages adjacent to a source line. During the program operations performed in the reverse program order, bit line voltages applied to bit lines may also be changed and applied according to a program order of a selected page. For example, the earlier a program operation on a page is performed, that is, the closer the page is disposed to a bit line, the greater a bit line voltage applied to a bit line may be set. The later a program operation on a page is performed, that is, the closer the page is disposed to a source line, the smaller a bit line voltage applied to a bit line may be set.

A memory device may perform program operations in different program orders other than the normal program order and the reverse program order as described above.

For example, after a first program operation is performed such that program operations on memory cells are sequentially performed in a first direction (for example, a bit line direction) from a memory cell disposed in the central area of a memory string among memory cells coupled in series between a source line and a bit line, a second program operation may be performed such that program operations on the remaining memory cells are sequentially performed in a second direction (for example, a source line direction). Alternatively, after a first program operation is performed such that program operations on memory cells are sequentially performed in a second direction (for example, a source line direction) from a memory cell disposed in the central area of a memory string among memory cells coupled in series between a source line and a bit line, a second program operation may be performed such that program operations on the remaining memory cells are sequentially performed in a first direction (for example, a bit line direction). In other examples, after a first program operation is performed such that program operations are sequentially performed on memory cells from memory cells adjacent to a bit line to a memory cell disposed in the central area of a memory string, a second program operation may be performed such that program operations are sequentially performed on memory cells from memory cells adjacent to a source line to a memory cell disposed in the central area of the memory string. In other examples, after a first program operation is performed such that program operations are sequentially performed on memory cells from memory cells adjacent to a source line to a memory cell disposed in the central area of a memory string, a second program operation may be performed such that program operations are sequentially performed on memory cells from memory cells adjacent to a bit line to a memory cell disposed in the central area of the memory string.

In addition, a plurality of memory cells included in a memory string may be divided into at least two groups and program operations may be sequentially or alternately performed on groups. For example, a plurality of memory cells may be divided into a first group adjacent to a source line and a second group adjacent to a bit line, and program operations may be sequentially performed on a first group and a second group, or program operations may be performed on memory cells by alternately selecting the memory cells included in the first group and the memory cells included in the second group.

According to an embodiment, even when the program operations based on the various program orders as described above are performed, a change in channel current during a program verify operation, which is caused by a change in values of drain resistance and source resistance of memory cells included in a selected page according to a program order, may be compensated by changing and applying a bit line voltage applied to a bit line during a program verify operation according to the program order.

Figure 9:
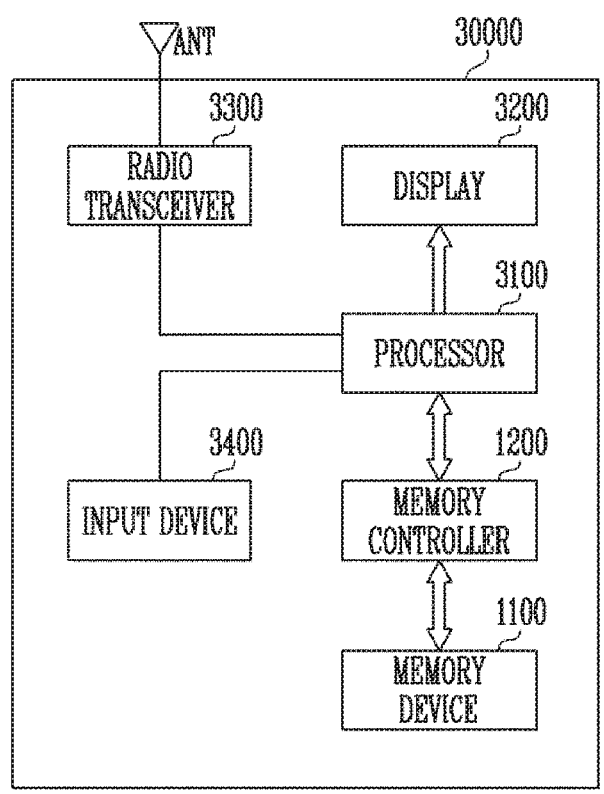
FIG. 9 is a diagram illustrating a memory system including the memory device of FIG. 1.

FIG. 9 is a diagram illustrating a memory system 30000 including a memory device 1100, such as the memory device 100 shown in FIG. 1.

Referring to FIG. 9, the memory system 30000 may be embodied into a cellular phone, a smartphone, a tablet PC, a personal digital assistant (PDA), or a wireless communication device. The memory system 30000 may include the memory device 1100 and a memory controller 1200 controlling the operations of the memory device 1100. The memory controller 1200 may control a data access operation of the memory device 1100, for example, a program operation, an erase operation, or a read operation in response to control of a processor 3100.

Data programmed into the memory device 1100 may be output through a display 3200 in response to control of the memory controller 1200. The memory device 1100 may be configured and operated in the same manner as the memory device 100 shown in FIG. 1.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 into a radio signal and output the radio signal to an external device through the antenna ANT. A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from the input device 3400 may be output through the display 3200.

According to an embodiment, the memory controller 1200 controlling the operations of the memory device 1100 may form part of the processor 3100, or be formed as a separate chip from the processor 3100.

Figure 10:
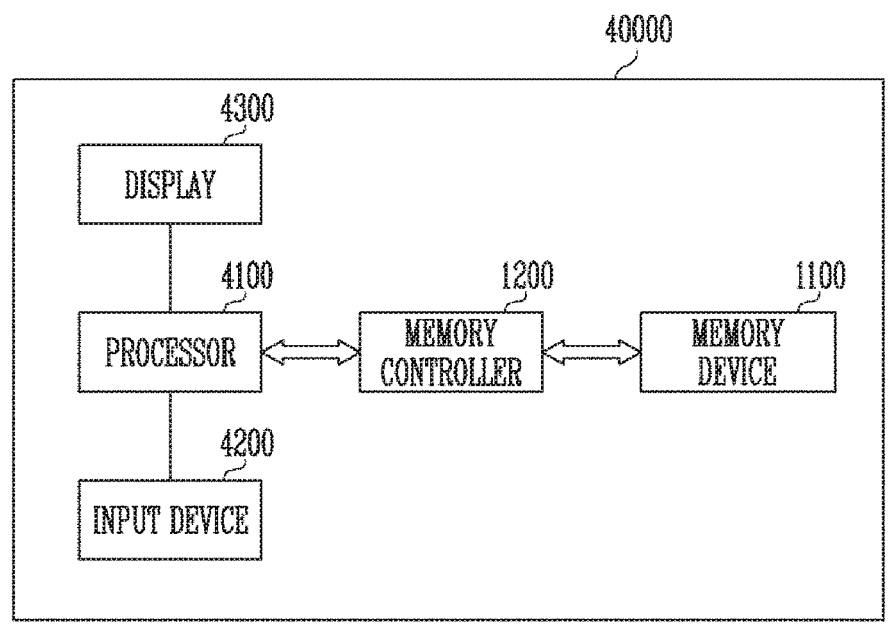
FIG. 10 is a diagram illustrating another embodiment of a memory system.

FIG. 10 is a diagram illustrating another embodiment of a memory system.

Referring to FIG. 10, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100. The memory device 1100 may be configured and operated in the same manner as the memory device 100 shown in FIG. 1.

A processor 4100 may output data stored in the memory device 1100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may be part of the processor 4100, or be formed as a separate chip from the processor 4100.

Figure 11:
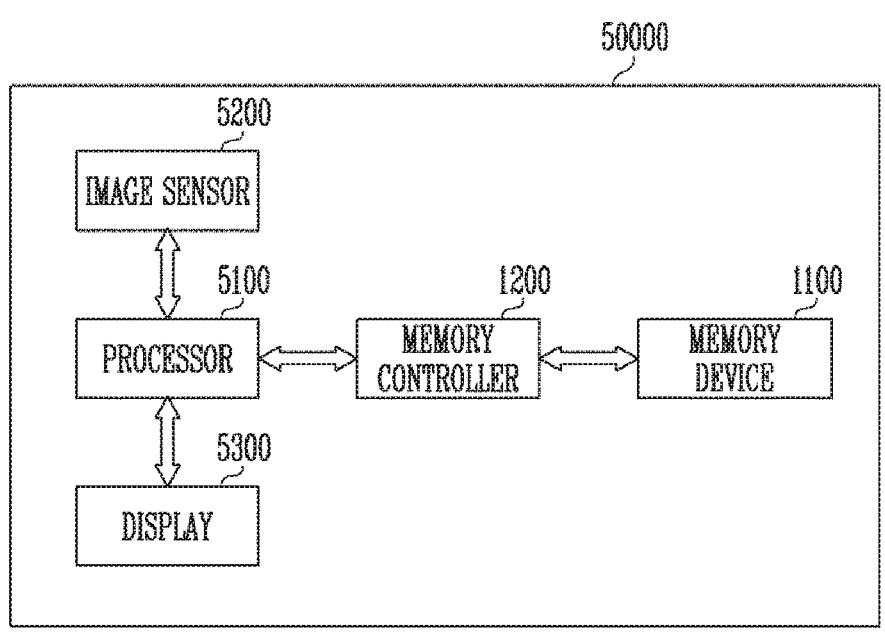
FIG. 11 is a diagram illustrating another embodiment of a memory system.

FIG. 11 is a diagram illustrating another embodiment of a memory system.

Referring to FIG. 11, a memory system 50000 may be provided as an image processing device, for example, a digital camera, a mobile phone attached with a digital camera, a smartphone attached with a digital camera, or a tablet PC attached with a digital camera.

The memory system 50000 may include the memory device 1100 and the memory controller 1200 controlling a data processing operation of the memory device 1100, for example, a program operation, an erase operation, or a read operation. The memory device 1100 may be configured and operated in the same manner as the memory device 100 shown in FIG. 1.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the memory controller 1200. In addition, data stored in the memory device 1100 may be output through the display 5300 according to control of the processor 5100 or the memory controller 1200.

According to an embodiment, the memory controller 1200 controlling the operations of the memory device 1100 may be part of the processor 5100, or be formed as a separate chip from the processor 5100.

Figure 12:
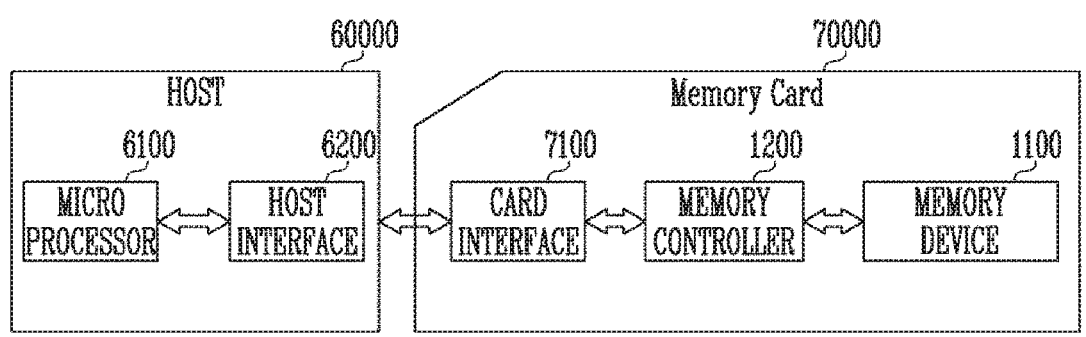
FIG. 12 is a diagram illustrating another embodiment of a memory system.

FIG. 12 is a diagram illustrating another embodiment of a memory system.

Referring to FIG. 12, a memory system 70000 may include a memory card or a smart card. The memory system 70000 may include the memory device 1100, the memory controller 1200, and a card interface 7100. The memory device 1100 may be configured and operated in the same manner as the memory device 100 shown in FIG. 1.

The memory controller 1200 may control data exchange between the memory device 1100 and the card interface 7100. According to an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 in response to control of a microprocessor 6100.

According to the present disclosure, the reliability of a program operation may be improved by adjusting a bit line voltage applied to a bit line and applying the adjusted bit line voltage to the bit line when a program verify operation is performed according to a program order of a plurality of pages.

It will be apparent to those skilled in the art that various modifications can be made to the above-described embodiments of the present teachings without departing from the spirit or scope of the present teachings. Thus, it is intended that the present teachings cover all such modifications provided they come within the scope of the appended claims and their equivalents.

As described above, although the present teachings are described using a limited number of embodiments and drawings, the present teachings are not limited to the above-stated embodiments. It is possible for those skilled in the art to which the present teachings pertain to make variations and modifications to the disclosed embodiments and still be consistent with the present teachings described above.

In the above-described embodiments, all steps may be selectively performed or skipped. In addition, the steps in each embodiment need not always be performed in a regular or presented order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the teachings described herein will still fall within the spirit and scope of the present disclosure as defined in the accompanying claims and equivalents thereof.

What is claimed is:

1. A memory device, comprising:
   a memory cell block including a plurality of pages, wherein each of the plurality of pages corresponds to a word line of a plurality of word lines;
   a peripheral circuit configured to perform a program operation on the plurality of pages; and
   control logic configured to control the peripheral circuit to perform the program operation, the control logic changing and setting a bit line voltage applied to bit lines of the memory cell block during a program verify operation of the program operation according to a program order of each of the plurality of pages,
   wherein bit line voltages corresponding to pages, which are programmed early among a plurality of pages are set to a higher-level than bit line voltages corresponding to pages, which are programmed later, in both a normal programming order and a reverse programming order, and
   wherein the control logic controls the peripheral circuit to sequentially program the plurality of pages corresponding to the plurality of word lines in order from pages adjacent to the source line, based on the normal programming order, or to sequentially program the plurality of pages corresponding to the plurality of word lines in order from pages adjacent to the bit line, based on the reverse programming order.

2. The memory device of claim 1, wherein the control logic divides the plurality of pages into a plurality of groups and controls the peripheral circuit to perform the program operation by sequentially selecting the plurality of groups or by alternately selecting pages included in each of the plurality of groups.

3. The memory device of claim 1, wherein the control logic increases and sets the bit line voltage when the program order is early, and decreases and sets the bit line voltage when the program order is later.

4. The memory device of claim 3, wherein the bit line voltage is gradually decreased according to the program order.

5. The memory device of claim 1, wherein the peripheral circuit applies a set bit line voltage to the bit lines before applying a verify voltage to a selected word line among the plurality of word lines during the program verify operation.

6. The memory device of claim 1, wherein at least one page correspond to the each of the plurality of word lines, and
   wherein the peripheral circuit applies the bit line voltage having a same potential to the bit lines during the program operation of the at least one page.

7. A memory device, comprising:
a memory cell block including a plurality of pages, wherein each of the plurality of pages corresponds to a word line of a plurality of word lines sequentially disposed between a source line and bit lines;
a peripheral circuit configured to perform a program operation on the plurality of pages; and
control logic configured to control the peripheral circuit to perform the program operation, the control logic gradually decreasing and setting a bit line voltage applied to the bit lines of the memory cell block during a program verify operation of the program operation according to a program order of each of the plurality of pages,
wherein bit line voltages corresponding to pages, which are programmed early among a plurality of pages are set to a higher-level than bit line voltages corresponding to pages, which are programmed later, in both a normal programming order and a reverse programming order, and
wherein the control logic controls the peripheral circuit to sequentially program the plurality of pages corresponding to the plurality of word lines in order from pages adjacent to the source line, based on the normal programming order, or to sequentially program the plurality of pages corresponding to the plurality of word lines in order from the bit lines, based on the reverse programming order.

8. The memory device of claim 7, wherein the peripheral circuit applies a set bit line voltage to the bit lines before applying a verify voltage to a selected word line among the plurality of word lines during the program verify operation.

9. The memory device of claim 7, wherein at least one page corresponds to the each of the plurality of word lines, and
wherein the peripheral circuit applies the bit line voltage having a same potential to selected bit lines among the bit lines during the program verify operation of the at least one page.

10. A method of operating a memory device, the method comprising:
providing a memory block including a plurality of pages, wherein each of the plurality of pages corresponds to a word line of a plurality of word lines;
setting a different bit line voltage for each of the plurality of pages according to a program order of each of the plurality of pages; and
performing a program operation by sequentially selecting the plurality of pages, a set bit line voltage being applied to bit lines of the memory block during a program verify operation of the program operation;
wherein bit line voltages corresponding to pages, which are programmed early among a plurality of pages are set to a higher-level than bit line voltages corresponding to pages, which are programmed later, in both normal programming order and reverse programming order, and
wherein the plurality of pages are sequentially programmed in order from pages adjacent to a source line according to the normal programming order, and the plurality of pages are sequentially programmed in order from pages adjacent to the bit lines according to the reverse programming order.

11. The method of claim 10, wherein, during the setting of the bit line voltage, the bit line voltage is set to be relatively high when the program order of a corresponding page is early, and the bit line voltage is set to be relatively low when the program order of the corresponding page is later.

12. The method of claim 10, wherein at least one page corresponds to the each of the plurality of word lines, and wherein the at least one page is set such that a same bit line voltage corresponds to the at least one page.

* * * * *